(12) United States Patent
Hsieh et al.

(10) Patent No.: US 9,337,049 B1
(45) Date of Patent: May 10, 2016

(54) MANUFACTURING METHOD OF WAFER LEVEL CHIP SCALE PACKAGE STRUCTURE

(71) Applicants: NIKO SEMICONDUCTOR CO., LTD., New Taipei (TW); SUPER GROUP SEMICONDUCTOR CO., LTD., New Taipei (TW)

(72) Inventors: Chih Cheng Hsieh, Taoyuan County (TW); Hsiu Wen Hsu, Hsinchu County (TW)

(73) Assignees: NIKO SEMICONDUCTOR CO., LTD., New Taipei (TW); SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/694,256

(22) Filed: Apr. 23, 2015

(30) Foreign Application Priority Data

Oct. 20, 2014 (TW) ............................. 103136129 A

(51) Int. Cl.
| | |
|---|---|
| *H01L 21/56* | (2006.01) |
| *H01L 21/304* | (2006.01) |
| *H01L 21/306* | (2006.01) |
| *H01L 21/78* | (2006.01) |
| *H01L 29/78* | (2006.01) |
| *H01L 21/768* | (2006.01) |
| *H01L 21/48* | (2006.01) |

(52) U.S. Cl.
CPC ........ *H01L 21/304* (2013.01); *H01L 21/30604* (2013.01); *H01L 21/4842* (2013.01); *H01L 21/76852* (2013.01); *H01L 21/76895* (2013.01); *H01L 21/78* (2013.01); *H01L 29/7827* (2013.01)

(58) Field of Classification Search
CPC ............ H01L 2224/94; H01L 2224/11; H01L 2224/97; H01L 25/0657
See application file for complete search history.

(56) References Cited

U.S. PATENT DOCUMENTS

| | | | |
|---|---|---|---|
| 8,796,138 B2* | 8/2014 | Cotte ................ H01L 21/76898 257/621 |
| 8,963,336 B2* | 2/2015 | Jung ....................... H01L 24/96 257/774 |
| 2011/0221054 A1* | 9/2011 | Lin ........................ H01L 21/568 257/692 |
| 2013/0037935 A1* | 2/2013 | Xue .................. H01L 21/76898 257/737 |
| 2015/0279798 A1* | 10/2015 | Park ........................ H01L 24/14 257/737 |
| 2015/0287619 A1* | 10/2015 | Ho .................... H01L 21/67092 438/48 |

* cited by examiner

*Primary Examiner* — Jaehwan Oh
(74) *Attorney, Agent, or Firm* — Li & Cai Intellectual Property (USA) Office

(57) ABSTRACT

A manufacturing method of wafer level chip scale package structure is provided. Firstly, a wafer including a plurality of semiconductor devices is provided. An active surface of one of the semiconductor devices has an active an active region and an outer region. A first electrode and a second electrode are arranged on the active region, and the outer region has a cutting portion and a channel portion. Next, a patterned protecting layer having a plurality of openings is formed on the active surface to respectively expose the first and second electrodes and channel portion. Subsequently, a wafer back thinning process is performed and then a back electrode layer is deposited. Subsequently, the channel portion is etched to form a trench exposing the back electrode layer, and a conductive structure connected to the back electrode layer is formed through the trench. Thereafter, the wafer is cut along the cutting portion.

12 Claims, 11 Drawing Sheets

MANUFACTURING METHOD OF WAFER LEVEL CHIP SCALE PACKAGE STRUCTURE

BACKGROUND OF THE INVENTION

1. Field of the Invention

The instant disclosure relates to a semiconductor package process, in particular, to a manufacturing method of a wafer level chip scale package structure.

2. Description of Related Art

The wafer level chip scale packaging (WLCSP) process is an advanced packaging technology, which allows a large quantity of wafers to be encapsulated in the same process. Additionally, after the wafer level chip scale packaging process, the size of the product is equal to or slightly larger than that of the power semiconductor chip. Accordingly, the technology of encapsulating the power devices by using the WLCSP process has been developed in today's industry.

SUMMARY OF THE INVENTION

The object of the instant disclosure is to provide a manufacturing method of a wafer level chip scale package structure, in which a conductive structure is arranged in the channel portion to connect the back electrode layer of the semiconductor device. In addition, the conductive structure does not extend to a cutting portion, and a cutting process is performed to form a plurality of separated package structures along the cutting portion without the conductive structure.

In order to achieve the aforementioned objects, according to an embodiment of the instant disclosure, a manufacturing method of wafer level chip scale package structure is provided. Firstly, a wafer having a plurality of semiconductor devices is provided. One of the semiconductor devices, a first semiconductor device, has an active surface and a back surface. The active surface includes an active region and an outer region. A first electrode and a second electrode are arranged in the active region, and the outer region is divided into a cutting portion and a channel portion. Subsequently, a patterned protecting layer having a plurality of openings is formed on the active surface to respectively expose the first electrode, the second electrode, and the channel portion. Next, a thinning process is performed upon the first semiconductor device from the back surface, and then a back electrode layer is formed on the back surface of the first semiconductor device. Subsequently, an etching process is performed to form a trench exposing the back electrode layer at the channel portion. Thereafter, a conductive structure is formed through the trench to connect the back electrode layer. Subsequently, a cutting process is performed on the cutting portion.

In the manufacturing method of a wafer level chip scale package structure according to an embodiment of the instant disclosure, the trench formed in the channel portion of the outer region extends from the active surface to the back surface so that the conductive structure formed through the trench can be in contact with the back electrode layer. Accordingly, the back electrode layer can be electrically connected to the other components through the conductive structure exposed on the active surface.

Additionally, when the cutting process is performed, the wafer is cut along the cutting portion. That is, during the cutting process, the cutting tool of the cutting machine is used to cut the semiconductor material and a thinner back electrode layer instead of a thicker metal material layer. Accordingly, the attrition rate of the cutting tool can be reduced.

In order to further the understanding regarding the instant disclosure, the following embodiments are provided along with illustrations to facilitate the disclosure of the instant disclosure.

DETAILED DESCRIPTION OF THE PREFERRED EMBODIMENTS

In the following description, numerous specific details of the manufacturing method of wafer level chip scale package structure according to the embodiments of the instant disclosure are set forth in order to provide a thorough understanding of one or more aspects and/or features described herein. It will be apparent, to one skilled in the art, to readily understand the advantages and the effectiveness of the instant disclosure. Furthermore, the instant disclosure can also be implemented or applied by various other specific examples. The details in the following descriptions can also be modified or changed based on different perspectives and applications without departing from the spirit of the instant disclosure. In addition, the drawings as referred to throughout the description of the instant disclosure are for illustrative purpose only, but not drawn according to actual scale, i.e., the actual scale of the related structure is not illustrated. The relative techniques of the instant disclosure will be set forth through the following embodiments, but are not intended to limit the scope of the instant disclosure.

Figure 1:
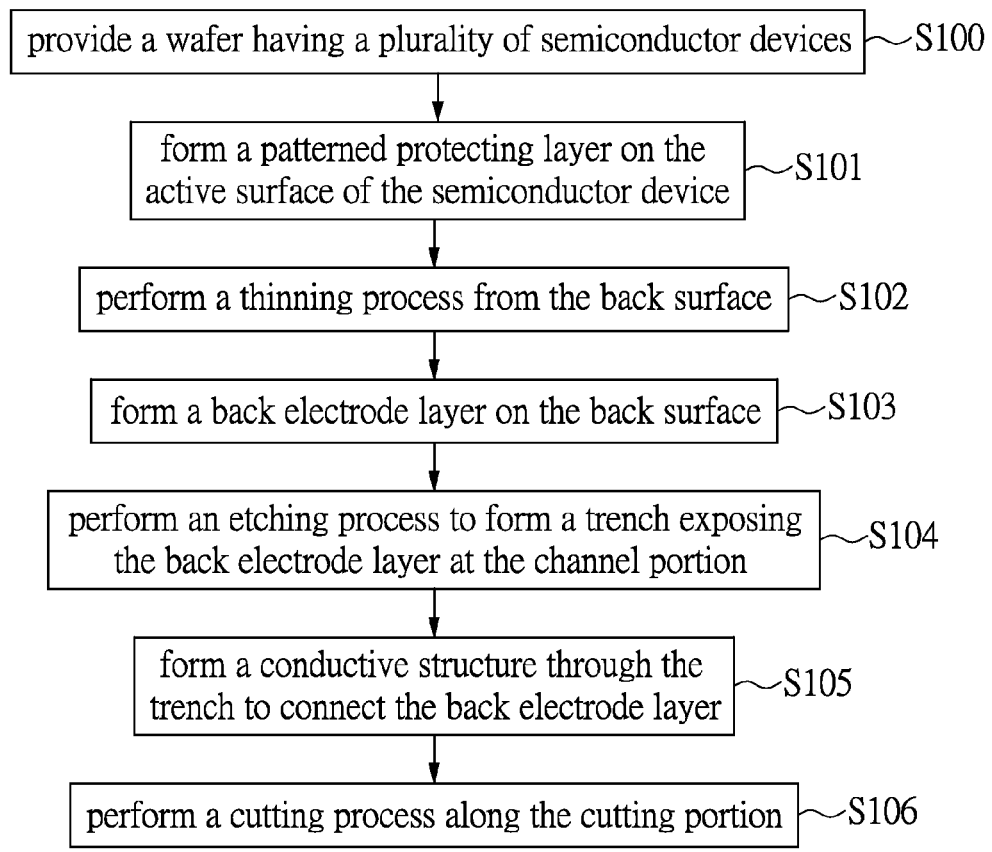
FIG. 1 shows a flow chart of the manufacturing method of wafer level chip scale package structure in accordance with an embodiment of the instant disclosure.

Please refer to FIG. 1. FIG. 1 shows a flow chart of the manufacturing method of wafer level chip scale package structure in accordance with an embodiment of the instant disclosure.

In step S100, a wafer 100 is provided. The wafer is usually made of Si or other semiconductor materials, such as GaAs. In the embodiment of the instant disclosure, the wafer 100 has a thickness of 350 to 680 μm. Please refer to FIG. 2A, which shows a top view of the wafer 100. In the embodiment of the instant disclosure, the processes of fabricating the devices on the wafer 100 have been completed, and the wafer 100 includes a plurality of semiconductor devices.

In an embodiment of the instant disclosure, the first semiconductor device 1 and the second semiconductor device 2 of the semiconductor devices are taken as an example to clarify the manufacturing method of a wafer level chip scale package structure. The first semiconductor device 1 and the second semiconductor device 2, for example, are vertical metal-oxide-semiconductor field effect transistors (MOSFET) or other power devices. In the instant embodiment, the first and second semiconductor devices 1 and 2 are vertical MOSFETs.

In the manufacturing method of the wafer level chip scale package structure, the first and second semiconductor devices 1 and 2 are packaged in a common package structure. In other words, each of the package structures can have at least two semiconductor devices. However, in another embodiment, only one semiconductor device, such as only the first semiconductor device, is packaged in one package structure after the manufacturing method of the wafer level chip scale package structure.

Figure 2A:
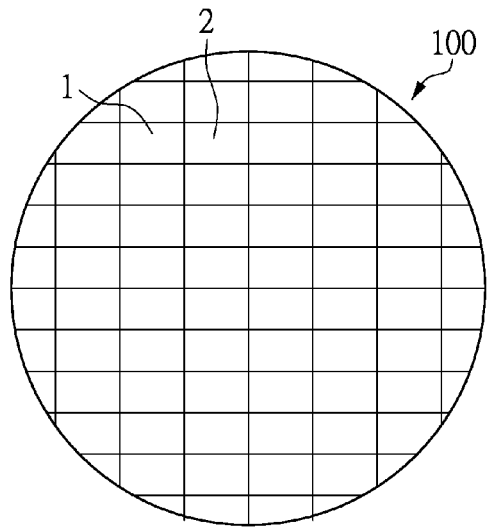
FIG. 2A shows a top view of a wafer.
Figure 2B:
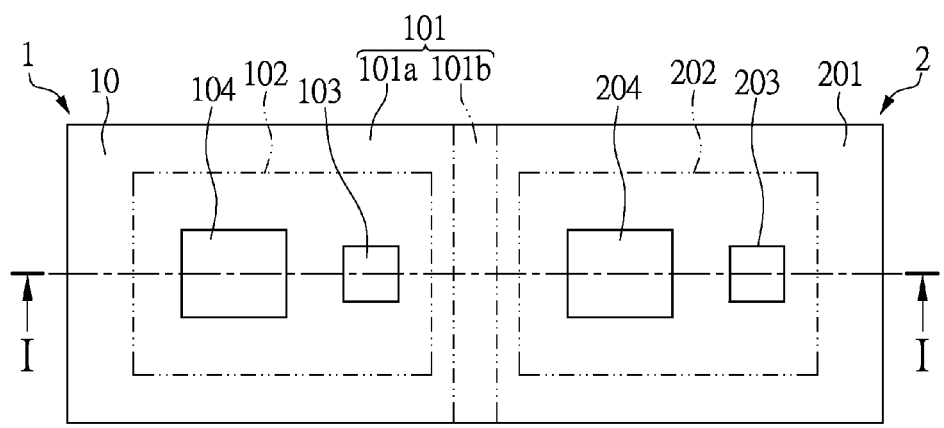
FIG. 2B shows an enlarged view of a first and second semiconductor devices shown in FIG. 2A.
Figure 2C:
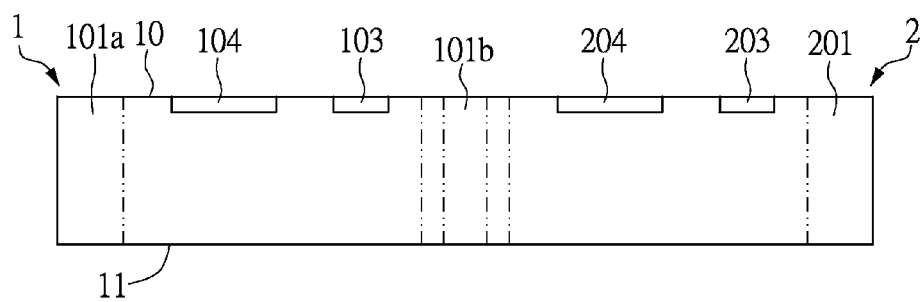
FIG. 2C shows a sectional view taken along a line I-I in FIG. 2B.

Please refer to FIG. 2B and FIG. 2C. FIG. 2B shows an enlarged view of the first and second semiconductor devices shown in FIG. 2A, and FIG. 2C shows a sectional view taken along a line I-I in FIG. 2B. The first semiconductor device 1 has an active surface 10 and a back surface 11 opposite thereto, in which the back surface 11 is a portion of the back of the wafer 100.

The active surface 10 of the first semiconductor device 1 has an outer region 101 and an active region 102 defined thereon, in which the outer region 101 surrounds the active region 102, i.e., the outer region 101 is formed on a peripheral region of the first semiconductor device 1. The active region 102 is defined in a central region of the first semiconductor device 1. A first electrode 103 and a second electrode 104 are arranged in the active region 102.

The second semiconductor device 2 is immediately adjacent to the first semiconductor device 1 and has a structure similar to that of the first semiconductor device 1. Specifically, the active surface 10 of second semiconductor device 2 also has an active region 202 and an outer region 201, and a first electrode 203 and a second electrode 204 are arranged in the active region 202. In an embodiment of the instant disclosure, the first electrodes 103, 203 can serve as gate electrodes, and the second electrodes 104, 204 can serve as source electrodes. In one embodiment, one of the source electrodes has a stacked structure, such as a Cu/Si/Al stacked structure.

Additionally, the outer region 201 of the second semiconductor device 2 and the outer region 101 of the first semiconductor device 1 mate to form a continuous surface which surrounds the active region 102 of the first semiconductor device 1 and the active region 202 of the second semiconductor device 2.

It is worth nothing that the outer region 101 of the first semiconductor device 1 can be divided into a cutting portion 101a and a channel portion 101b, in which the channel portion 101b is located between the active region 102 of the first semiconductor device 1 and the active region 202 of the second semiconductor device 2.

In the instant embodiment, notably, two semiconductor devices sharing the same channel portion are taken as an example. In another embodiment of the instant disclosure, each of semiconductor devices can correspond to one channel portion, or a plurality of the semiconductor device corresponds to one channel portion. Thus, the configuration and the correspondence between the semiconductor device and the channel portion are not intended to limit the instant disclosure.

Figure 3:
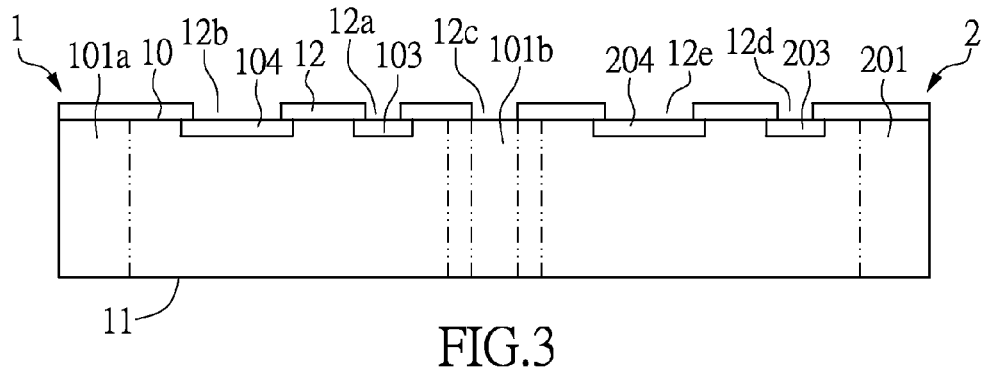
FIG. 3 shows a sectional view of the localized wafer level chip scale package structure in a step of the manufacturing method in FIG. 1 in accordance with another embodiment of the instant disclosure.

Please refer to FIG. 1 and FIG. 3. Subsequently, in the step S101, a patterned protecting layer 12 is formed on the active surface 10. The patterned protecting layer 12 can be a dielectric layer for protecting the active region 102 of the first semiconductor device 1 and the active region 202 of the second semiconductor device 2 from being contaminated, which may impact on the device characteristics. In addition, the patterned protecting layer 12 can serve as a mask during the subsequent process steps.

The patterned protecting layer 12 can be made of phosphosilicate glass, polyimide or nitride. In the instant embodiment, the patterned protecting layer 12 has a thickness ranging from 1 μm to 10 μm.

Please refer to FIG. 3. FIG. 3 illustrates a sectional view of the localized wafer level chip scale package structure in a step S101 of the manufacturing method in FIG. 1 in accordance with another embodiment of the instant disclosure. As shown in FIG. 3, the patterned protecting layer 12 has a plurality of openings 12a-12e. In the instant embodiment, the openings 12a-12c respectively expose the first electrode 103, the second electrode 104 and the channel portion 101b of the first semiconductor device 1, and the openings 12d-12e respectively expose the first electrode 203 and the second electrode 204 of the second semiconductor device 2.

Specifically, in an embodiment of the instant disclosure, a margin area of the first electrodes 103 and a margin area of the second electrode 104 of the first semiconductor device 1 are covered by the patterned protecting layer 12, but a central area of the first electrode 103 and a central area of the second electrode 104 are exposed respectively through the openings 12a and 12b. Similarly, the patterned protecting layer 12 covers the margin areas of the first and second electrodes 203 and 204 of the second semiconductor device 2 but exposes the central areas of the first and second electrodes 203 and 204.

In addition, in the instant embodiment, the opening 12c of the patterned protecting layer 12 exposes the channel portion 101b. Specifically, the patterned protecting layer 12 completely covers the cutting portion 101a of the first semiconductor device 1 and the outer region 201 of the second semiconductor device 2.

Figure 4:
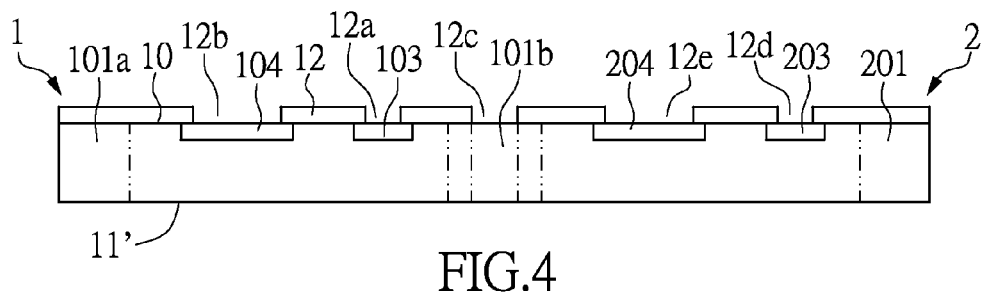
FIG. 4 shows a sectional view of the localized wafer level chip scale package structure in a step of the manufacturing method in FIG. 1 in accordance with another embodiment of the instant disclosure.

Please refer to FIG. 1 again. In the step S102, a thinning process is performed upon the first semiconductor device 1 and the second semiconductor device 2 from the back surface 11. In the instant embodiment, the back surfaces 11 of the first and second semiconductor devices 1 and 2 are coplanar and mate to form a continuous surface. In addition, both of the back surfaces 11 of the first and second semiconductor devices 1 and 2 are portions of the back of the wafer 100. Accordingly, the same reference numerals are given to the back surfaces of the first and second semiconductor devices 1 and 2. Please refer to FIG. 4. FIG. 4 shows a sectional view of the localized wafer level chip scale package structure in the step S102 of the manufacturing method in FIG. 1 in accordance with another embodiment of the instant disclosure. In the embodiment shown in FIG. 4, taking the first and second semiconductor devices 1 and 2 as examples for description.

In one embodiment, the thinning process can be a back-grinding process, i.e., the thinning process is performed upon the first semiconductor device 1 and the second semiconductor device 2 from the back surface 11 by using a grinding machine. That is, the thinning process is performed upon the back of the wafer 100 to reduce the thickness of the wafer 100. In addition, before the thinning process is performed, the active surface 10 having the active regions 102 and 202 of the first and second semiconductor devices 1 and 2 can be protected by attaching an adhesive tape. In an embodiment of the instant disclosure, the thickness of the wafer 100 is reduced to a range between 125 μm to 180 μm.

Figure 5:
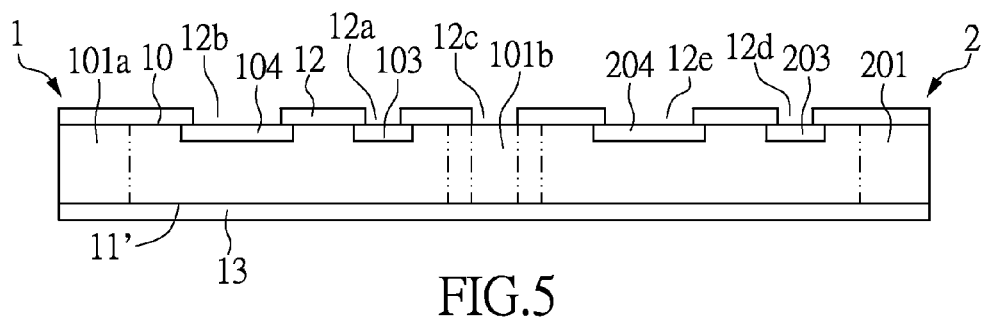
FIG. 5 shows a sectional view of the localized wafer level chip scale package structure in a step of the manufacturing method in FIG. 1 in accordance with another embodiment of the instant disclosure.

Please refer to FIG. 1, after the thinning process, proceed to step S103, in which a back electrode layer 13 is formed on the back surfaces 11' of the grinded first and second semiconductor devices 1 and 2. Please refer to FIG. 5. FIG. 5 shows a sectional view of the localized wafer level chip scale package structure in the step S103 of the manufacturing method in FIG. 1 in accordance with another embodiment of the instant disclosure. Notably, in the embodiment shown in FIG. 5, the back electrode layer 13 extends from the back surface 11' of the first semiconductor device 1 to the back surface 11' of the second semiconductor device 2 so that the first semiconductor device 1 and the second semiconductor device 1 share the same back electrode layer 13. Although FIG. 5 shows the back electrode layer 13 is formed on the back surfaces 11' of the first and second semiconductor devices 1 and 2, one of ordinary skill in the art knows, in reality, the back electrode layer 13 is formed on the entire wafer back.

Furthermore, the back electrode layer 13 can be a conductive layer to serve as a drain electrode of the first semiconductor device 1. In one embodiment, the back electrode layer 13 is a metal-stacked layer, such as a Ti/Ni/Ag stacked layer, in which the titanium layer has a thickness of 200 nm, the nickel layer has a thickness of 300 nm, and the silver layer has a thickness of 2000 nm. In another embodiment, the back electrode layer 13 can be a Ti/Cu stacked layer. However, the other material also can be made of the back electrode layer 13, and thus the aforementioned materials and the structure of the back electrode layer 13 are not intended to limit the instant disclosure.

In addition, in step S103, the back electrode layer 13 can be formed by, but not limit to, chemical vapor deposition (CVD) or physical vapor deposition (PVD), such as evaporation or sputtering deposition.

Figure 6:
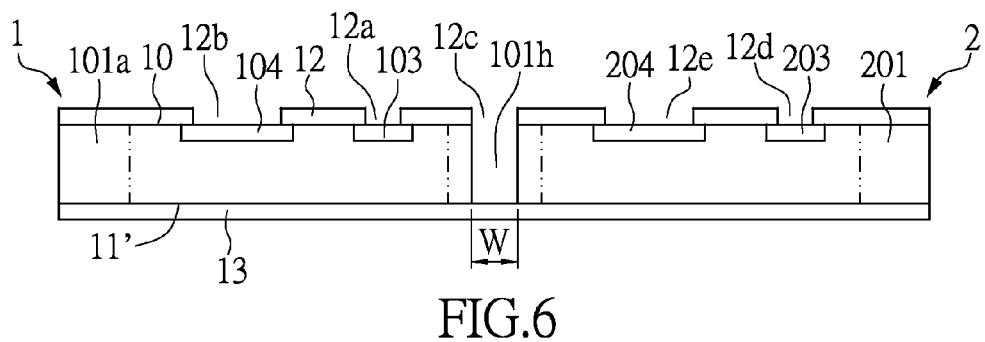
FIG. 6 shows a sectional view of the localized wafer level chip scale package structure in a step of the manufacturing method in FIG. 1 in accordance with another embodiment of the instant disclosure.

Please refer to FIG. 1. In step S104, an etching process is performed to form a trench 101h exposing the back electrode layer 13 at the channel portion 101b. Please refer to FIG. 6. FIG. 6 shows a sectional view of the localized wafer level chip scale package structure in the step S104 of the manufacturing method in FIG. 1 in accordance with another embodiment of the instant disclosure. In one embodiment, a selective etching process, such as a silicon etching process, is performed.

Notably, unlike the first electrodes 103, 203 or the second electrode 104, 204, the region of the channel portion 101b exposed by the opening 12c is not covered by any electrode layer. Accordingly, the portion of wafer 100 located in the exposed region of the channel portion is removed during the silicon etching process to form the trench 101h.

In addition, in the selective etching process, the back electrode layer 13 can serve as an etch stop layer. For example, during the silicon etching process, the channel portion 101b is etched until the top surface of the back electrode layer 13 is exposed. Thus, the trench 101h extends from the active surface 10 to the top surface of the back electrode layer 13 to expose a portion of the back electrode layer 13 after the selective etching process is performed.

In the embodiment of the instant disclosure, the trench 101h has a width (W) ranging from 3 to 30 μm.

However, the abovementioned embodiment does not intend to limit the instant disclosure. In another embodiment, the wafer may be cut by a knife through the opening 12c, and then be etched by a wet etching to form the trench 101h.

Figure 7A:
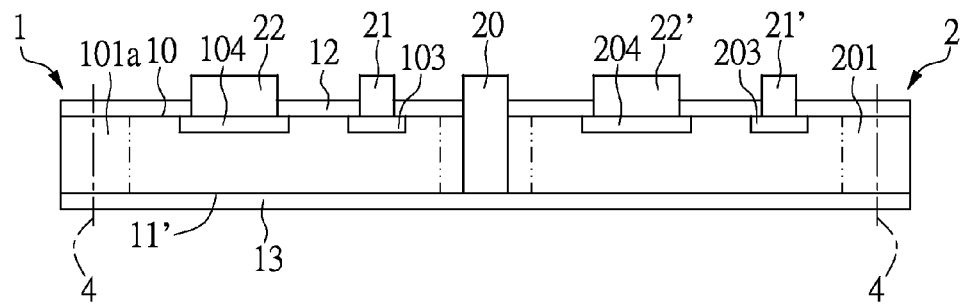
FIG. 7A shows a sectional view of the localized wafer level chip scale package structure in a step of the manufacturing method in FIG. 1 in accordance with another embodiment of the instant disclosure.
Figure 7B:
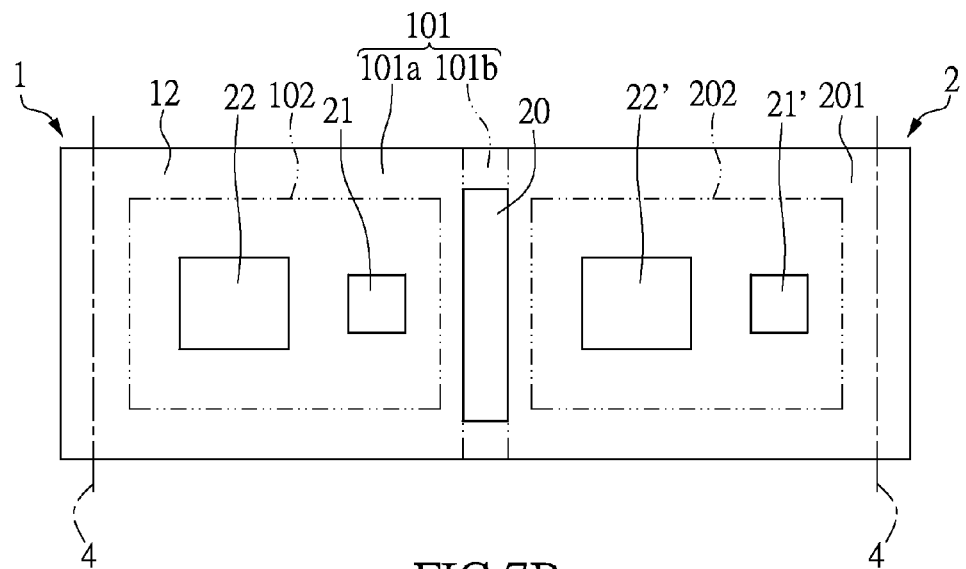
FIG. 7B shows a top view of the localized wafer level chip scale package structure in a step of the manufacturing method in FIG. 1 in accordance with another embodiment of the instant disclosure.

Please refer to FIG. 1 and together with FIGS. 7A and 7B. FIG. 7A shows a sectional view of the localized wafer level chip scale package structure in the step S105 of the manufacturing method in FIG. 1, and FIG. 7B shows a top view of the localized wafer level chip scale package structure in the step S105 of the manufacturing method in FIG. 1 in accordance with another embodiment of the instant disclosure.

Subsequently, in step S105 illustrated in FIG. 1, a conductive structure 20 is formed through the trench to connect the back electrode layer 13. As shown in FIGS. 7A and 7B, the conductive structure has a wall body, and the top of the wall body is disposed at a higher level than the top surface of the patterned protecting layer 12.

In addition, a first pad 21 in contact with the first electrode 103 of the first semiconductor device 1 and a second pad 22 in contact with the second electrode 104 can be formed respectively through the openings 12a and 12b at the same step of forming the conductive structure 20. Similarly, a first pad 21' in contact with the first electrode 203 of the second semiconductor device 2 and a second pad 22' of the second electrode 204 can be formed respectively through the openings 12d and 12e at the same step of forming the conductive structure 20. In the instant embodiment of the instant disclosure, the conductive structure 20 is located between the first pad 21 of the first semiconductor device 1 and the second pad 22' of the second semiconductor device 2.

It is worth nothing that the first pad 21 and the second pad 22 of the first semiconductor device 1 and the first pad 21' and the second pad 22' of the second semiconductor device 2 are formed on the active surface 10. When the first and second semiconductor devices 1 and 2 are assembled on a printed circuit board (not shown), the first electrode 103, the second electrode 104, and the back electrode layer 13 of the first semiconductor device 1 are, respectively by the first pad 21, the second pad 22, and the conductive structure 20, electrically connected to the components (not shown) mounted on the printed circuit board (not shown). Similarly, the first and second electrodes 203 and 204 of the second semiconductor device 1 can be, respectively by the first and second pad 21' and 22', electrically connected to the other components mounted on the printed circuit board.

Notably, in the instant embodiment, the conductive structure 20 is formed between the active region 102 of the first semiconductor device 1 and the active region 202 of the second semiconductor device 2. In addition, the conductive structure 20, to function as a drain pad, is electrically connected to the back electrode layer 13 shared by the first and second semiconductor devices 1 and 2. As such, the first and second semiconductor devices 1 and 2 can share the same drain pad. That is, the drain regions of the first and second semiconductor devices 1 and 2 are electrically connected to each other through the back electrode layer 13, and the drain pad, i.e., the conductive structure 20, of the first and second semiconductor devices 1 and 2 can be exposed on the active surface 10. In addition, the conductive structure 20 also can serve as the electrode pad for testing purposes. Furthermore, after the first and second semiconductor devices 1 and 2 are electrically connected to the printed circuit board through the conductive structure 20, the printed circuit board can provide a heat dissipation effect for the first and second semiconductor devices 1 and 2 by connecting to the conductive structure 20.

In addition, as illustrated in FIG. 7B, the conductive structure 20 of the instant embodiment is formed in a localized region of the channel portion 101b. In another embodiment, the conductive structure 20 may formed transversely through the length of the channel portion 101b between the first and second semiconductor devices 1 and 2.

Figure 8A:
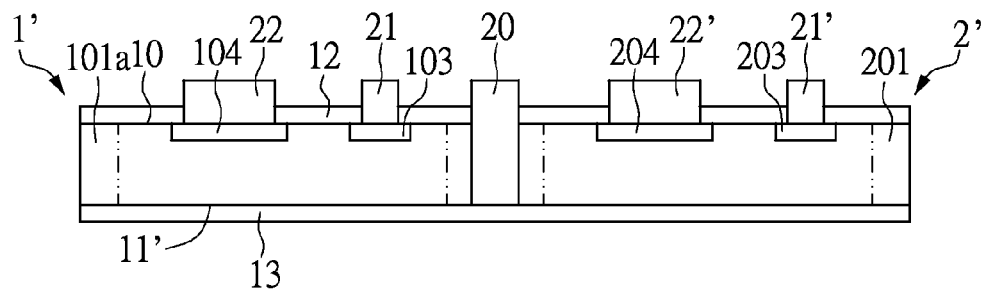
FIG. 8A shows a sectional view of the package structure after the cutting process of the manufacturing method in accordance with another embodiment of the instant disclosure.
Figure 8B:
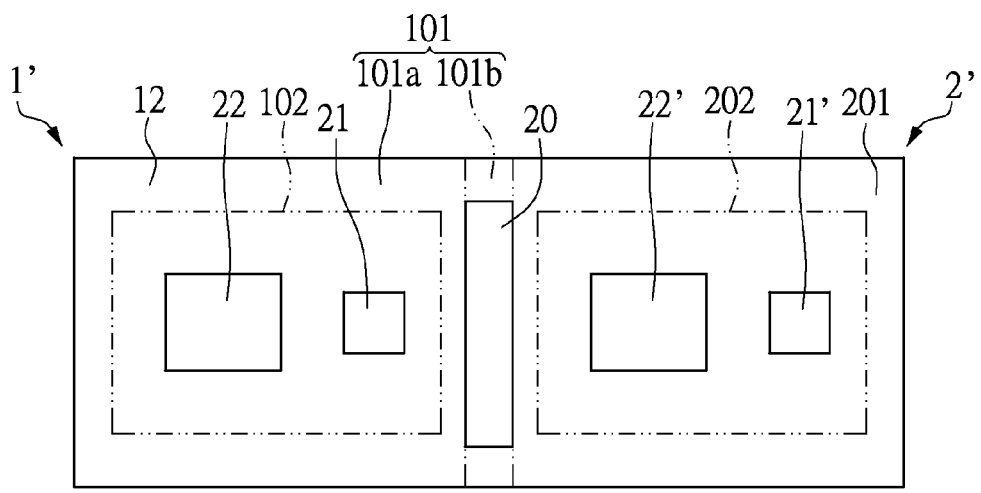
FIG. 8B shows a top view of the localized wafer level chip scale package structure in a step of the manufacturing method in accordance with another embodiment of the instant disclosure.

Please refer to FIG. 1. Subsequently, in step S106, a cutting process is performed to form a plurality of separated package structures M1. In the instant embodiment, the cutting process is performed on the cutting portion 101a of the outer region 101 and the outer region 201. In one embodiment, the cutting process is performed by a cutting machine Please refer to FIGS. 7A, 7B, 8A and 8B, in which FIG. 8A shows a sectional view of the package structure after the cutting process in accordance with another embodiment of the instant disclosure, and FIG. 8B shows a top view of the package structure after the cutting process in accordance with another embodiment of the instant disclosure. As shown in FIGS. 7A and 7B, the cutting process includes the step of cutting the wafer 100 along a plurality of cutting lines 4 (only two are shown in FIGS. 7A and 7B) defined on the outer region 201 and the cutting portion 101a of the outer region 101. Because the conductive structure 20 is not formed on the cutting portion 101a of the outer region 101, the cutting tool of the cutting machine is used to cut the semiconductor material and a thinner back electrode layer instead of a thicker metal material layer. Accordingly, the attrition rate of the cutting tool can be reduced.

Figure 9:
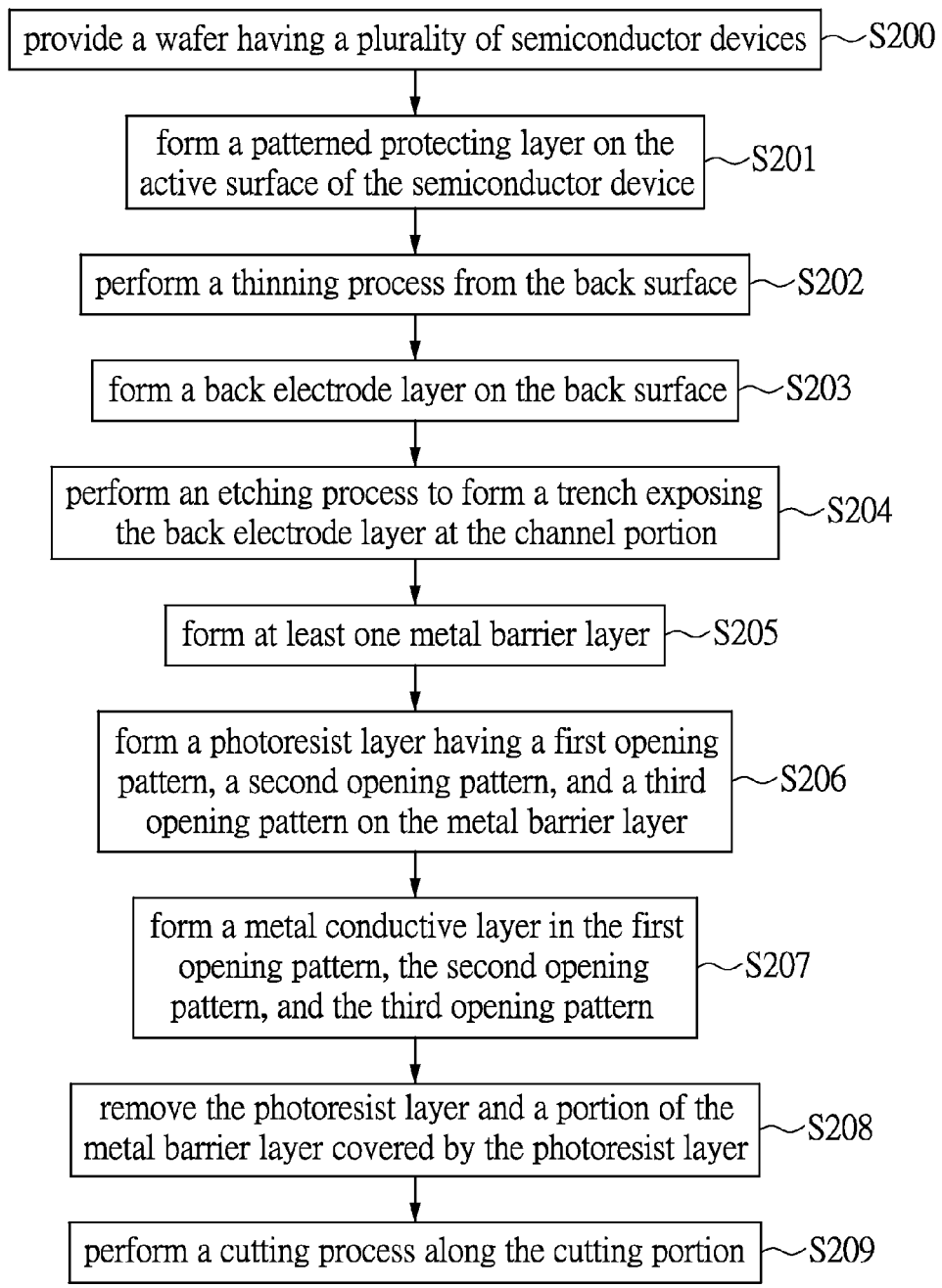
FIG. 9 shows a flow chart of the manufacturing method of wafer level chip scale package structure in accordance with another embodiment of the instant disclosure.

Please refer to FIG. 9. FIG. 9 shows a flow chat of the manufacturing method of wafer level chip scale package structure in accordance with another embodiment of the instant disclosure.

A difference between this embodiment and the previous embodiment is that only one semiconductor device, instead of two semiconductor devices, is packaged to form the package structure. In addition, in the instant embodiment, each of the packaged semiconductor device corresponds to one channel portion. The first semiconductor device 1 is taken as an example in the following description to explain the manufacturing method of wafer level chip scale package structure in detail. The same components as those described in aforementioned embodiments are denoted by the same reference numerals.

Figure 10A:
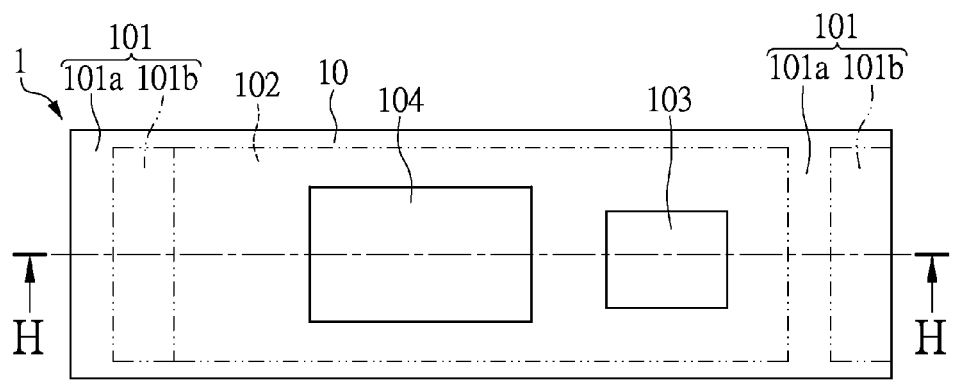
FIG. 10A shows a top view of a first semiconductor device.
Figure 10B:
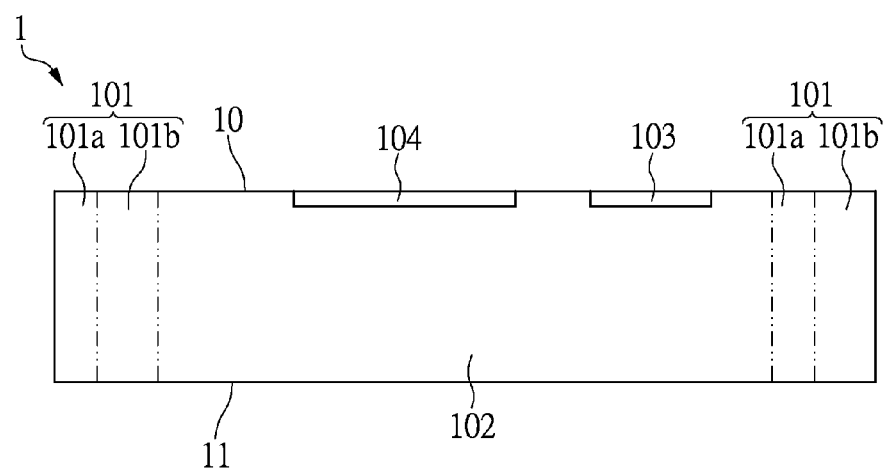
FIG. 10B shows a sectional view taken along a line H-H in FIG. 1 OA.

Please refer to FIGS. 9, 10A and 10B. FIG. 10A shows a top view of a first semiconductor device, FIG. 10B shows a sectional view taken along a line H-H in FIG. 10A.

In the instant embodiment, the active surface 10 of the first semiconductor device 1 has the outer region 101 and the active region 102 defined thereon, in which the outer region 101 of the first semiconductor device 1 is also divided into a cutting portion 101a and a channel portion 101b. Notably, in the instant embodiment, the cutting portion 101a and the channel portion 101b located at the same side of the active region 102 of the first semiconductor device 1, and the cutting portion 101a is farther from the active region 102 than the channel portion 101b. That is, the channel portion 101b is located between the active region 102 and the cutting portion 101a.

Figure 10C:
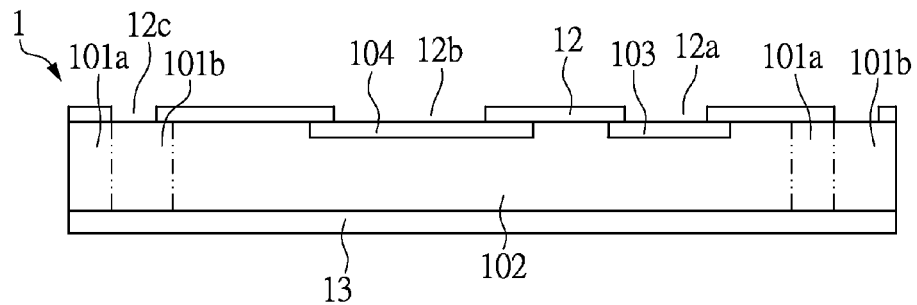
FIG. 10C to FIG. 10J respectively show sectional views of the localized wafer level chip scale package structure in different steps of the manufacturing method in FIG. 9 in accordance with another embodiment of the instant disclosure.
Figure 10D:
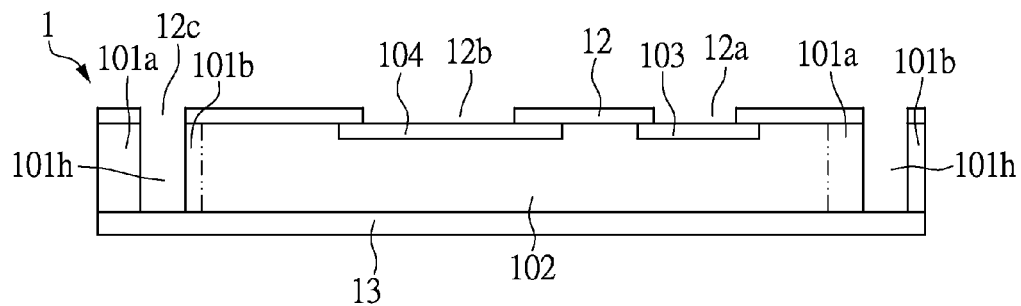

Additionally, FIGS. 10B to 10D are respectively corresponding to the steps S200 to S204 shown in FIG. 9. Because the steps S200 to S204 are respectively the same as the steps S100 to S104, the descriptions of the common portion are omitted. That is, as shown in FIG. 10D, after the step S204, the patterned protecting layer 12 and the back electrode layer 13 are respectively formed on the active surface and the back surface of the first semiconductor device 1, and the channel portion 101b has the trench 101h formed therein.

A difference between this embodiment and the previous embodiment is the step of forming the conductive structure through the trench 101h to connect the back electrode layer 13, and the step of forming the first pad 21 and the second pad 22. Specifically, after the step S204 is performed, proceed to the step S205.

Figure 10E:
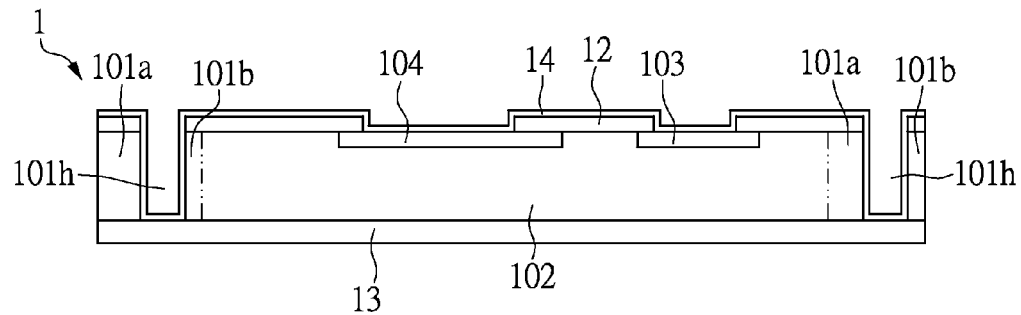

Please refer to FIG. 10E. FIG. 10E shows a sectional view of the localized wafer level chip scale package structure in step S205 of the manufacturing method in FIG. 9 in accordance with another embodiment of the instant disclosure. In step S205, at least one metal barrier layer 14 is formed.

As shown in FIG. 10E, the metal barrier layer 14 conformingly covers the inner walls of the trench 101h, the patterned protecting layer 12, the first electrode 103, and the second electrode 104. In the instant embodiment, the metal barrier layer 14 can be formed by evaporation or sputtering deposition and the metal barrier layer 14 can be made of the material selected from the group consisting of titanium, copper, tungsten and the combination thereof. In addition, the metal barrier layer 14 has a thickness ranging from 50 nm to 300 nm.

Figure 10F:
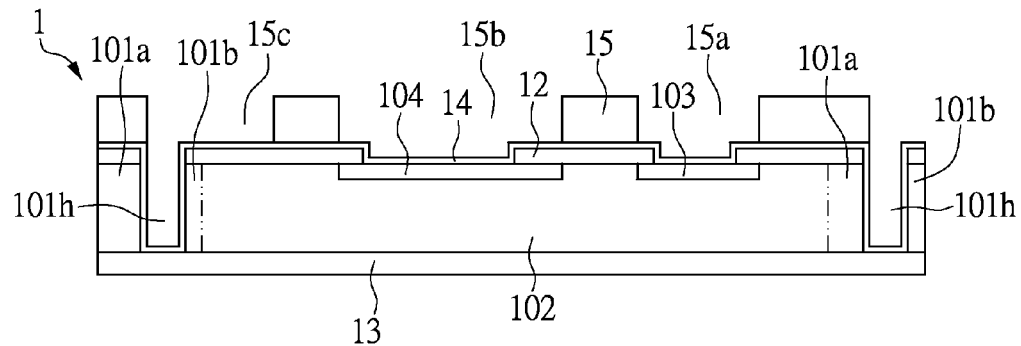

Please refer to FIGS. 9 and 10F. In step S206, a photoresist layer 15, which has a first opening pattern 15a, a second opening pattern 15b, and a third opening pattern 15c, is formed on the metal barrier layer 14.

Please refer to FIG. 10F. FIG. 10F shows a sectional view of the localized wafer level chip scale package structure in step S206. As illustrated in FIG. 10F, the first opening pattern 15a, the second opening pattern 15b and the third opening pattern 15c of the photoresist layer 15 respectively correspond to the positions of the first electrode 103, the second electrode 104 and the channel portion 101b to respectively define the locations and the shapes of the pads which will be formed in the following steps. In the instant embodiment, the pads are such as the first pad 21 and the second pad 22 described in the previous embodiment. In addition, in the instant embodiment, the thickness of the photoresist layer 15 is equal to the height of the pads which will be formed in the following step.

In one embodiment, the cutting portion 101a of the outer region 101 is completely covered by the photoresist layer 15. In addition, the size of the third opening pattern 15c is greater than the width of the trench 101h to expose the trench 101h, and portions of the metal barrier layer 14 formed on the channel portion 101b of the outer region 101 and formed on the active region 102. Notably, the shape and the position of a contact pad for electrically connecting to the back electrode layer 13 can be defined by the third opening pattern 15c. The contact pad may be used to electrically connect the back electrode layer 13 to the component mounted on the printed circuit board in the following processes.

Please refer to FIG. 9. In step S207, a metal conductive layer is formed in the first opening pattern 15a, the second opening pattern 15b, and the third opening pattern 15c. In the instant embodiment, the metal conductive layer has a laminated structure.

Figure 10G:
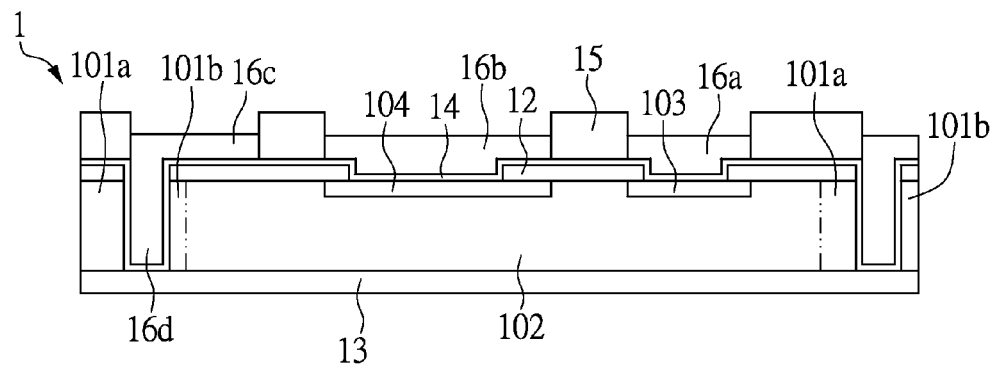
Figure 10H:
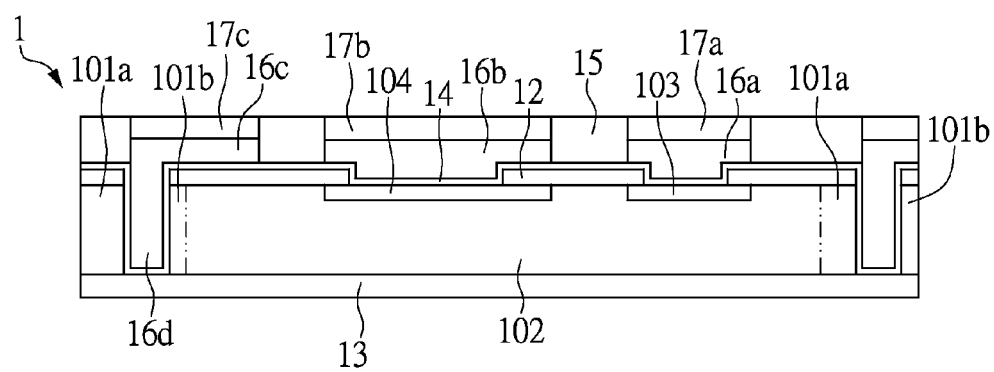

Please refer to FIGS. 10G and 10H. FIGS. 10G and 10H show sectional views of the localized wafer level chip scale package structure in step S207. As shown in FIG. 10G, the first opening pattern 15a, the second opening pattern 15b, the third opening pattern 15c, and the trench 101h are respectively filled with a plurality of first metal structures 16a-16d during the same step S207. Specifically, the trench 101h is filled with the first metal structure 16d, thereafter, the first opening pattern 15a, the second opening pattern 15b, and the third opening pattern 15c are respectively filled with other first metal structures 16a-16c.

That is, the first metal structure 16a is in contact with the first electrode 103, while another first metal structure 16b is in contact with the second electrode 104. In addition, the first metal structure 16d is formed inside the trench 101h to be in contact with the back electrode layer 13, and the first metal structure 16c formed on the region of the active surface 10 which is immediately adjacent to the trench 101h and extends from the position of the trench 101h to the active region 102.

The first metal structures 16a-16d can be made of copper, nickel or the combination thereof. In another embodiment, the first metal structures 16a-16d may be made of other conductive materials. In the instant embodiment, each of the top portions of the first metal structures 16a-16d is lower than the top of the photoresist layer 15.

Subsequently, as shown in FIG. 10H, the first opening pattern 15a, the second opening pattern 15b, and the third opening pattern 15c are respectively filled with a plurality of second metal structures 17a-17c. In the instant embodiment, each of the top portions of the second metal structures 17a-17c is disposed at the same level as the top of the photoresist layer 15. In addition, the second metal structures 17a-17c can be made of, for example, tin so that the first semiconductor device 1 can be assembled on the printed circuit board.

Figure 10I:
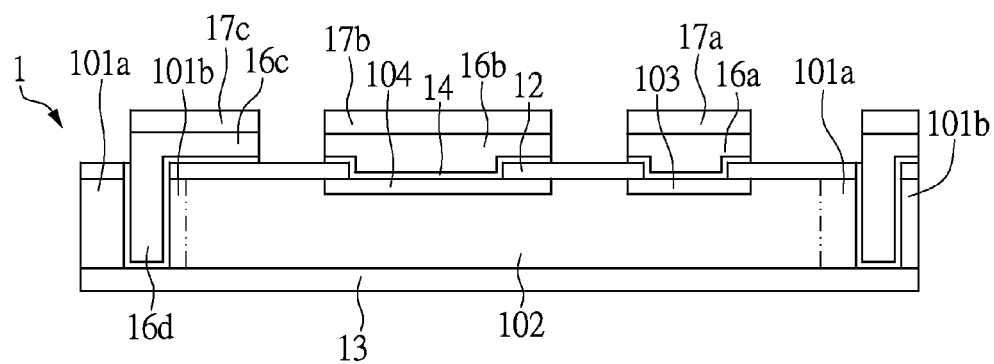

Please refer to FIG. 9. Subsequently, the step S208 is performed, in which the photoresist layer 15 and a portion of the metal barrier layer 14 covered by the photoresist layer 15 are removed. Please refer to FIG. 10I. FIG. 10I shows a sectional view of the localized wafer level chip scale package structure in step S208. After the photoresist layer 15 and the portion of the metal barrier layer 14 are removed, the metal conductive layers respectively formed in the first opening pattern 15a, the second opening pattern 15b, and the third opening pattern 15c are insulated from each other.

Please refer to FIG. 10I. The combination of the first and second metal structures 16a and 17a has a function similar to that of the first pad 21 shown in FIG. 7A. The combination of the first and second metal structures 16b and 17b has a function similar to that of the second pad 22 shown in FIG. 7A. Additionally, the first metal structure 16d formed inside the trench 101h is used to connect the back electrode layer 13, and the combination of the first and second metal structures 16c and 17c has a function similar to that of the contact pad for electrically connecting to the printed circuit board. In other words, in the instant embodiment, the conductive structure, which is used to contact the back electrode layer 13 through the trench 101h, has a connecting portion (the first metal structure 16d) formed inside the trench 101h and a contact pad (the combination of the first and second metal structures 16c and 17c) formed on the active surface 10. The connecting portion has a wall body connected between the back electrode layer 13 and the contact pad.

In the instant embodiment, the ball drop process is taken as an example to describe the instant disclosure. However, in another embodiment, after the step S104 (or S204), the solder bumping process or the Cu pillar bump process can be performed instead of the ball drop process.

Figure 10J:
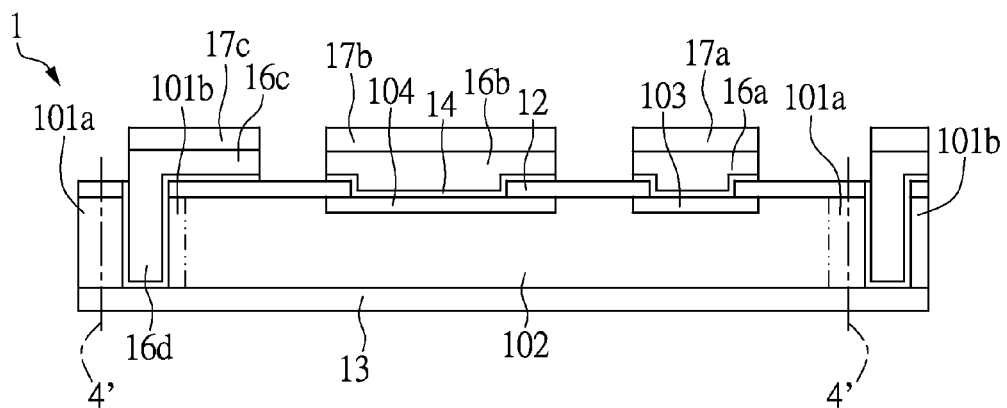

Subsequently, please refer to FIGS. 9 and 10J. FIG. 10J shows a sectional view of the localized wafer level chip scale package structure in step S209. Similar to the step S106 described in the previous embodiment, in step S209, a cutting process is performed on the cutting portion 101a of the outer region 101 to form a plurality of separated package structures M2. As shown in FIG. 10J, in the instant embodiment, the cutting process includes the step of separating the two immediately adjacent package structures M2 from each other along a plurality of cutting lines 4' (only two are shown in FIG. 10J) at the cutting portion 101a.

Figure 10K:
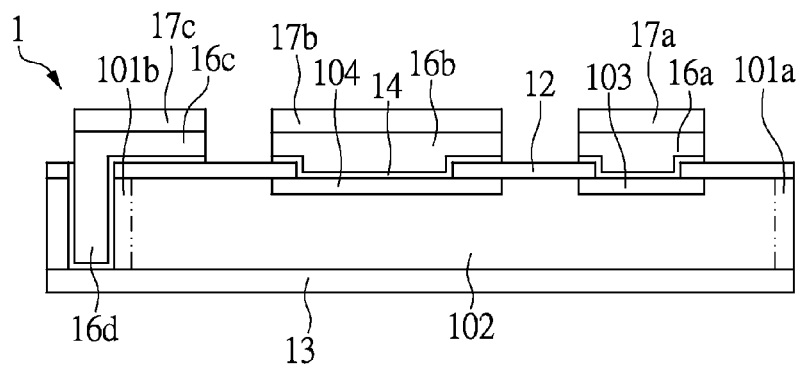
FIG. 10K shows a sectional view of the wafer level chip scale package structure after a cutting process.
Figure 10L:
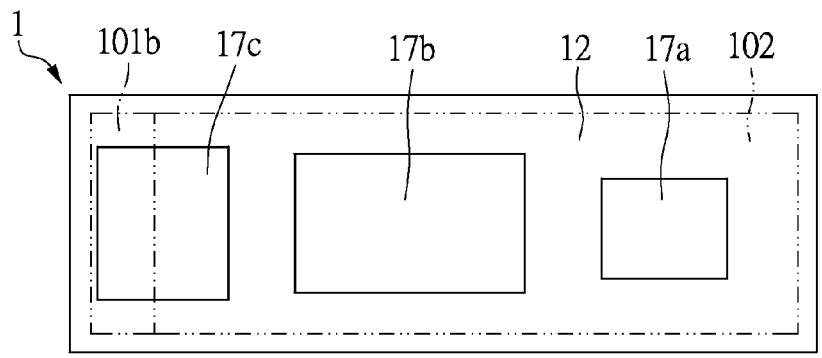
FIG. 10L shows a top view of the wafer level chip scale package structure after a cutting process.

Please refer to FIGS. 10K and 10L. FIG. 10K shows a sectional view of the wafer level chip scale package structure after the cutting process in accordance with another embodiment of the instant disclosure. FIG. 10L shows a top view of the wafer level chip scale package structure after the cutting process of the manufacturing method in accordance with another embodiment of the instant disclosure. After the manufacturing method shown in FIG. 9 is completed, the package structure M2 has a patterned protecting layer 12 formed on the active surface 10. In addition, at least one electrical connection between the package structure M2 and the component mounted on the printed circuit board can be established through the second metal structures 17a-17c.

Figure 11:
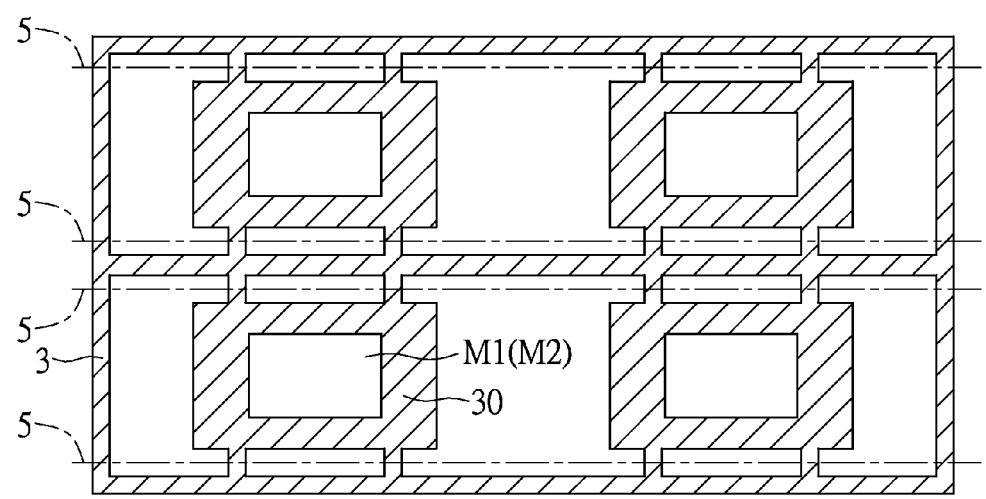
FIG. 11 shows a top view of the package structure placed on a lead frame.

Please refer to FIG. 11. FIG. 11 shows a top view of package structure placed on a lead frame. The package structure can be the package structure M1 shown in FIGS. 8A and 8B or the package structure M2 shown in FIGS. 10K and 10L. In addition, the manufacturing method of the wafer level chip scale package structure in accordance with the embodiment of the instant disclosure can further include the following steps:

First, a lead frame 3 is provided. Specifically, the lead frame includes a plurality of die pads 30, each of which has a surface to be in contact with the package structure M1 (or M2), as shown in FIG. 11.

Subsequently, the individual package structures M1 (or M2) after the cutting process are fixed on the die pads 30 by a thermal-conductive adhesive, and each of the package structures M1 (or M2) and each of the die pads 30 are assigned in a one-to-one manner with respect to each other. Specifically, before the package structures M1 (or M2) are placed on the die pads 30, the surface of each of die pads 30 is printed with the thermal-conductive adhesive (not shown). The thermal-conductive adhesive is, for example, an electrical-conductive adhesive, an insulation thermal conductive adhesive or a tin paste. Subsequently, each of the package structures M1 (or M2) can be picked up and respectively placed on the corresponding die pads 30 by a pick and place apparatus.

Thereafter, a thermal process is performed to cure the thermal conductive adhesive so that each of the package structures M1 (or M2) is fixed on the corresponding die pad 30. The thermal process can be performed by transferring the lead frame 3 into an oven and raising the temperature of the lead frame 3. Subsequently, the lead frame 3 is cut so that the plurality of die pads 30 is separated from the lead frame 3.

In the instant embodiment shown in FIG. 11, the lead frame 3 has a frame (not labeled) and a plurality of strips (not labeled) for holding each of the die pads 30. When the lead frame 3 is cut, the cutting tool can be used to cut the strips along the cutting lines 5 shown in FIG. 11 so that the die pads 30 are separated from the lead frame 3 and the final products (the wafer level scale package structures) are completed.

The Effectiveness of the Embodiments

In summary, the manufacturing methods of a wafer level chip scale package structure are provided in the abovementioned embodiments. In the manufacturing method, the channel portion has a trench which is filled with a conductive structure so that the back electrode layer can be electrically connected to other components through the conductive structure. Furthermore, the cutting process is performed on the cutting portion subsequent to forming the conductive structure.

Notably, during some of the wafer level chip scale package processes, a metal plate having thicker thickness is attached to the back of the wafer to serve as the back electrode. In addition, the scribing line has a groove formed therein and filled with the metal material so that the back electrode can extend to the active surface to serve as the pad for electrically connecting to the printed circuit board. Therefore, during the following cutting step, it is unavoidable for the cutting tool to cut the metal material and the metal plate. However, the cutting tool of the cutting machine usually has a thinner blade, and the metal plate and the metal material formed in the groove of the scribing line may result in higher attrition rate of the cutting tool.

In contrast, in the embodiments of the instant disclosure, no metal material is formed in the cutting portion, and the back electrode layer is thinner. Accordingly, only the semiconductor material and a thinner back electrode layer need to be cut by the cutting tool, which can reduce the attrition rate of the cutting tool.

Furthermore, the package structures are fixed on the die pads by the thermal-conductive adhesive after the cutting process. As such, the heat generated due to the operation of the semiconductor device packaged in the package structure can be dissipated through the thermal conductive adhesive and the die pad, which can avoid the performance of the semiconductor device from being impacted due to high temperature.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A manufacturing method of a wafer level chip scale package structure comprising:
   providing a wafer having a plurality of semiconductor devices, wherein a first semiconductor device of the semiconductor devices has an active surface and a back surface, the active surface has an active region and an outer region, a first electrode and a second electrode are arranged in the active region, and the outer region is divided into a cutting portion and a channel portion;
   forming an patterned protecting layer on the active surface, wherein the patterned protecting layer has a plurality of openings to respectively expose the first electrode, the second electrode, and the channel portion;
   performing a thinning process from the back surface;
   forming a back electrode layer on the back surface;
   performing an etching process to form a trench exposing the back electrode layer at the channel portion;
   forming a conductive structure through the trench to connect the back electrode layer; and
   performing a cutting process along the cutting portion.

2. The manufacturing method of the wafer level chip scale package structure according to claim 1, wherein a margin area of the first electrode and a margin area of the second electrode are covered by the patterned protecting layer.

3. The manufacturing method of the wafer level chip scale package structure according to claim 1, wherein the first electrode serves as a gate electrode, the second electrode serves as a source electrode, and the back electrode layer serves as a drain electrode.

4. The manufacturing method of the wafer level chip scale package structure according to claim 1, wherein the step of forming the conductive structure to connect the back electrode layer comprises forming a first pad and a second pad in the openings to be respectively in contact with the first electrode and the second electrode.

5. The manufacturing method of the wafer level chip scale package structure according to claim 1, wherein after the step of performing the etching process to form the trench exposing the back electrode layer at the channel portion, the manufacturing method further comprises:
   forming at least one metal barrier layer conformingly covering inner walls of the trench, the patterned protecting layer, the first electrode, and the second electrode;
   forming a photoresist layer on the metal barrier layer, wherein the photoresist layer has a first opening pattern, a second opening pattern, and a third opening pattern respectively corresponding to the first electrode, the second electrode, and the channel portion;
   forming a metal conductive layer in the first opening pattern, the second opening pattern, and the third opening pattern; and
   removing the photoresist layer and a portion of the metal barrier layer covered by the photoresist layer to form a first pad, a second pad, and the conductive structure.

6. The manufacturing method of the wafer level chip scale package structure according to claim 5, wherein the conductive structure includes a contact pad formed on the active surface and a connecting portion formed inside the trench.

7. The manufacturing method of the wafer level chip scale package structure according to claim 6, wherein the connecting portion has a wall body connected between the contact pad and the back electrode layer.

8. The manufacturing method of the wafer level chip scale package structure according to claim 5, wherein the metal conductive layer has a laminated structure.

9. The manufacturing method of the wafer level chip scale package structure according to claim 5, wherein the metal barrier layer is made of a material selected from the group consisting of titanium, copper, tungsten and the combination thereof.

10. The manufacturing method of the wafer level chip scale package structure according to claim 1, wherein after the step of performing the cutting process, a plurality of package structures separated from each other are formed, and the manufacturing method further comprises:
    providing an lead frame having a plurality of die pads; and
    respectively fixing the separated package structures on the die pads by a thermal conductive adhesive; and
    cutting the lead frame to separate the die pads from the lead frame.

11. The manufacturing method of the wafer level chip scale package structure according to claim 1, wherein a second semiconductor device of the semiconductor devices is immediately adjacent to the first semiconductor device, and the channel portion is located between the active region of the first semiconductor device and an active region of the second semiconductor device.

12. The manufacturing method of the wafer level chip scale package structure according to claim 11, wherein the back electrode layer extends to a back surface of the second semiconductor device.

* * * * *